(12) United States Patent
Vancoille et al.

(10) Patent No.: US 7,246,954 B2
(45) Date of Patent: Jul. 24, 2007

(54) OPTO-ELECTRONIC HOUSING AND OPTICAL ASSEMBLY

(75) Inventors: Eric Vancoille, Singapore (SG); Adrianus J. P. Van Haasteren, Singapore (SG); Frank Flens, Singapore (SG)

(73) Assignee: Avago Technologies Fiber IP (Singapore) Ltd. Pte., Singapore (SG)

( * ) Notice: Subject to any disclaimer, the term of this patent is extended or adjusted under 35 U.S.C. 154(b) by 0 days.

(21) Appl. No.: 10/915,202

(22) Filed: Aug. 9, 2004

(65) Prior Publication Data

US 2006/0029337 A1 Feb. 9, 2006

(51) Int. Cl.
 *G02B 6/36* (2006.01)

(52) U.S. Cl. .......................................... 385/94; 385/93

(58) Field of Classification Search .................. 385/50, 385/55, 80–95, 120–122, 14, 134; 372/29, 372/29.02, 26, 27, 28
See application file for complete search history.

(56) References Cited

U.S. PATENT DOCUMENTS

| | | | | |
|---|---|---|---|---|
| 4,904,036 A * | 2/1990 | Blonder | .................. | 385/14 |
| 5,586,207 A * | 12/1996 | Goodwin | .................. | 385/92 |
| 5,881,198 A * | 3/1999 | Haake | .................. | 385/136 |
| 6,124,663 A * | 9/2000 | Haake et al. | .................. | 310/307 |
| 6,283,644 B1 * | 9/2001 | Gilliland et al. | .................. | 385/93 |
| 6,351,027 B1 * | 2/2002 | Giboney et al. | .................. | 257/684 |
| 6,404,042 B1 | 6/2002 | Sone et al. | | |
| 6,597,713 B2 * | 7/2003 | Ouchi | .................. | 372/36 |
| 6,832,861 B2 * | 12/2004 | Kragl | .................. | 385/88 |
| 6,849,308 B1 * | 2/2005 | Speakman et al. | .................. | 427/595 |
| 6,953,291 B2 * | 10/2005 | Liu | .................. | 385/94 |
| 2003/0072009 A1 * | 4/2003 | Domash et al. | .................. | 356/519 |
| 2003/0126552 A1 | 7/2003 | Toshio et al. | | |
| 2003/0128552 A1 | 7/2003 | Takagi et al. | | |
| 2003/0151818 A1 * | 8/2003 | Wagner et al. | .................. | 359/578 |
| 2004/0076384 A1 | 4/2004 | Kato et al. | | |
| 2004/0264884 A1 * | 12/2004 | Liu | .................. | 385/89 |
| 2005/0058405 A1 | 3/2005 | Ebel | | |
| 2005/0078720 A1 * | 4/2005 | Walker et al. | .................. | 372/36 |
| 2005/0089280 A1 * | 4/2005 | Kumar et al. | .................. | 385/88 |
| 2005/0100290 A1 * | 5/2005 | Huang | .................. | 385/92 |

FOREIGN PATENT DOCUMENTS

| | | |
|---|---|---|
| DE | 10211677 A1 | 10/2003 |
| DE | 10211677 A1 | 10/2003 |
| EP | 0750204 A1 | 12/1996 |

(Continued)

OTHER PUBLICATIONS

Patent Abstracts of Japan, vol. 1995, No. 01, Feb. 28, 1995 & JP 06 302912 A Oct. 28, 1994.

(Continued)

*Primary Examiner*—Kevin S Wood

(57) ABSTRACT

An opto-electronic housing and an opto-electronic assembly. The housing includes an enclosure defining a cavity. An opening through a wall of the enclosure is adapted to receive a substrate. A mount projects into the cavity opposite the opening. The mount is adapted to support an opto-electronic device. Adjacent the mount is an optically transmissive region in a wall of the enclosure. An opto-electronic assembly also includes a substrate disposed in the opening and an opto-electronic device supported by the mount.

14 Claims, 5 Drawing Sheets

FOREIGN PATENT DOCUMENTS

| | | |
|---|---|---|
| EP | 0750204 A1 | 12/1996 |
| EP | 1180705 A2 | 8/2001 |
| EP | 1300711 A2 | 4/2003 |
| EP | 1300711 A2 | 4/2003 |
| JP | 06302912 A | 10/1994 |
| JP | 10214437 A | 8/1998 |

OTHER PUBLICATIONS

Patent Abstracts of Japan, vol. 1998, No. 13, Nov. 30, 1998 & JP 10 214437 A Aug. 11, 1998, Figures 3, 8.
EPO Search Report dated Dec. 9, 2005.

* cited by examiner

OPTO-ELECTRONIC HOUSING AND OPTICAL ASSEMBLY

BACKGROUND

Transmitter optical assemblies and receiver optical assemblies are known. Each such optical assembly typically includes a housing containing a substrate and an opto-electronic device. The opto-electronic device is electrically connected to a set of electrical contacts on the substrate using wire bonds. This set of electrical contacts on the substrate is in turn electrically connected, also using wire bonds, to first ends of a set of leads disposed within the housing. Second ends of the leads are accessible outside the housing. During manufacture the assembly is connected to a main circuit board carrying an electronic circuit to which the opto-electronic device is to be connected. This connection is effected by means of, for instance, a soldered connection between the second ends of the leads of the assembly and corresponding electrical conductors on the main circuit board.

Optical assemblies are typically used in optical transceivers of telecommunication network equipment and are expected to work for about ten years without any failure. The many levels of interconnections adversely affect the reliability of such assemblies. Furthermore, the opto-electronic device consists of an active light emitting or light receiving surface (or both) that must be accurately positioned so as to be optically aligned with a lens and a fiber receptacle attached to the housing. This alignment needs to be maintained over a range of operating temperatures.

For the foregoing reasons, it is necessary to carefully select the materials of which the optical assembly is fabricated so that thermal expansion will not cause optical misalignment. In addition, the material selected for the housing must allow for dissipation of any heat generated by the opto-electronic device. And the components of the optical assembly must be manufactured with high precision so that linear dimensions are accurate, usually to within about one micron, to prevent a stacking-up of tolerances that would hamper proper alignment.

SUMMARY OF THE INVENTION

In one aspect the invention provides an opto-electronic housing. The housing has an enclosure that defines a cavity. A first opening through the enclosure is adapted to receive a substrate. A mount projects into the cavity opposite the first opening. The mount is adapted to support an opto-electronic device. A wall of the enclosure adjacent the mount includes an optically transmissive region.

In another aspect the invention provides an opto-electronic assembly. The assembly includes an opto-electronic housing as described in the previous paragraph, a substrate disposed in the first opening and extending into the cavity, and an opto-electronic device supported by the mount. The substrate carries a plurality of electrical conductors, and the opto-electronic device is in electrical communication with these conductors.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention will be better understood with reference to the drawings, in which like elements are identified with like reference numerals and in which.

DETAILED DESCRIPTION

Figure 1:
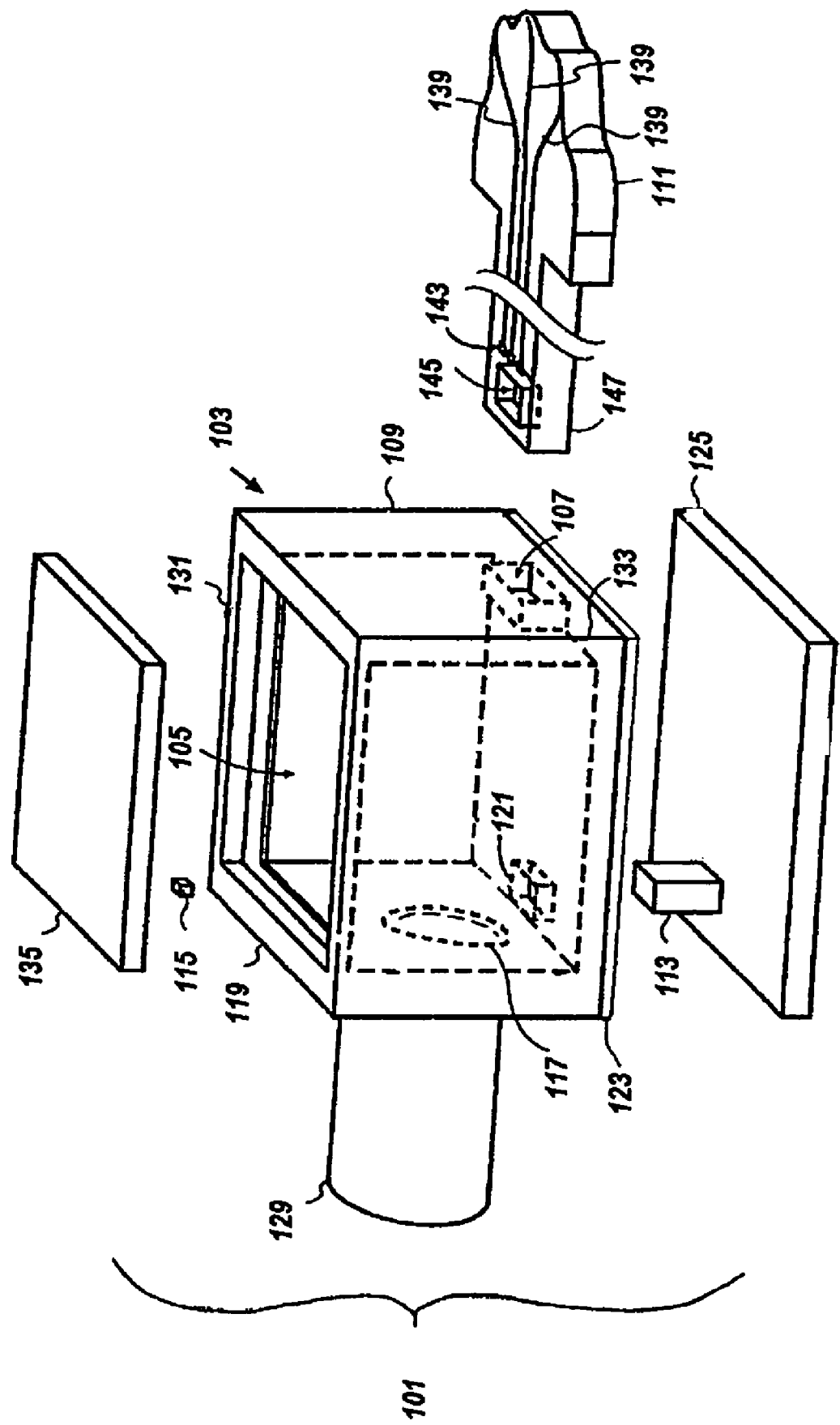
FIG. 1 is a partially exploded perspective view of an embodiment of an opto-electronic assembly according to the invention.

Referring to FIG. 1, an opto-electronic housing 101 includes an enclosure 103 defining a cavity 105. An opening 107 through a wall 109 of the enclosure is adapted to receive a substrate 111. A mount 113 projects into the cavity opposite the first opening. The mount is adapted to support an opto-electronic device 115. An optically transmissive region 117 is defined in a wall 119 of the enclosure adjacent the mount.

Figure 2:
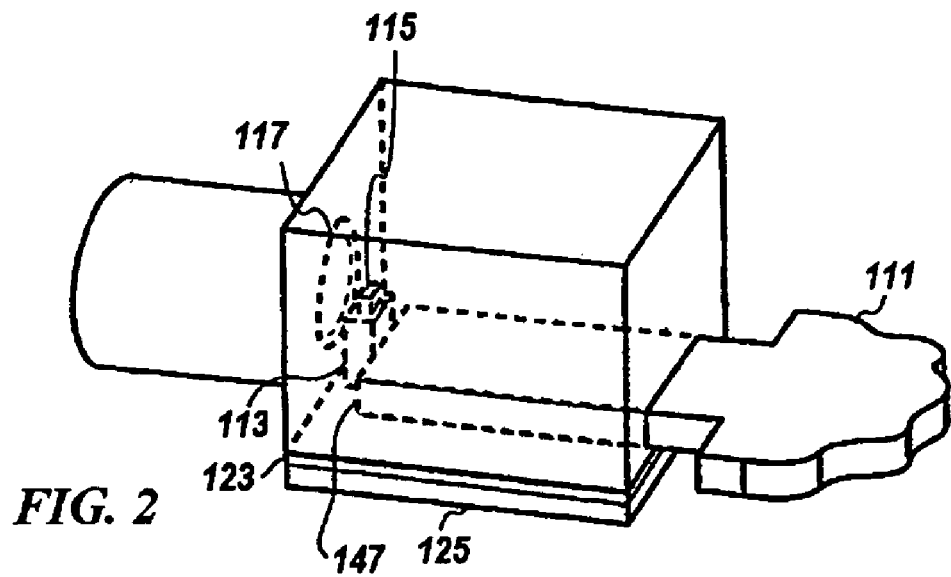
FIG. 2 is a perspective view of a portion of an alternate embodiment of an opto-electronic assembly.

In one embodiment the mount projects into the cavity through a second opening 121 in a wall 123 of the enclosure. In another embodiment the mount is integrally formed with the wall 123 as shown in FIG. 2.

A heat sink such as a heat-dissipating plate 125 in thermal communication with the mount may be disposed outside the enclosure. In the embodiment shown in FIG. 1, the heat-dissipating plate is substantially planar with the wall 123.

Figure 3:
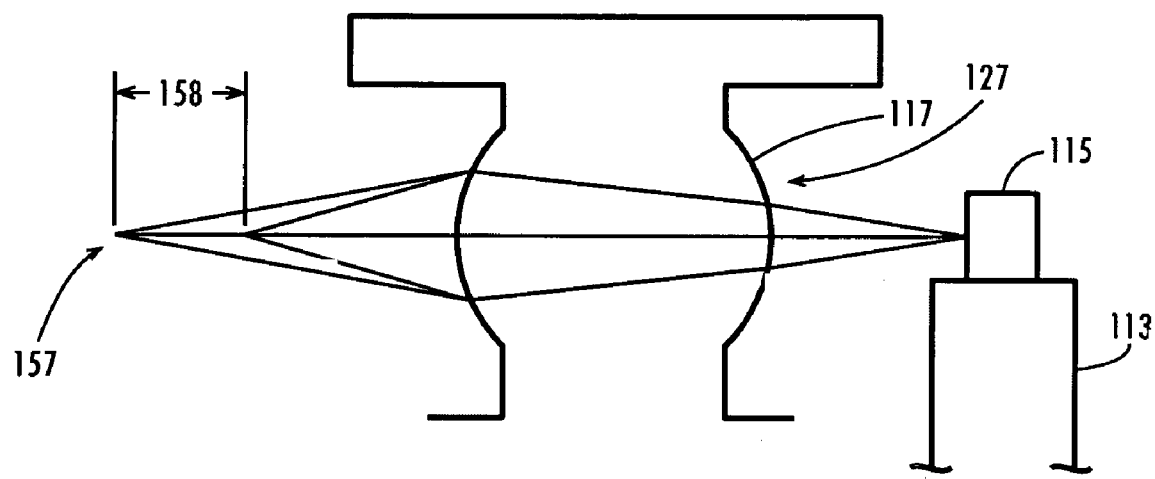
FIG. 3 is a detail side view of a portion of the embodiment shown in FIG. 1.

In one embodiment the optically transmissive region 117 is an opening in the wall 119. In another embodiment the optically transmissive region is a lens 127 as shown in FIG. 3. A receptacle 129 may be connected to the enclosure over the optically transmissive region. The receptacle may be adapted to receive an optical fiber ferrule (not shown).

In one embodiment the enclosure 103 is formed of adjoining walls including the opposite walls 109 and 119, the wall 123 connecting the walls 109 and 119, and sidewalls 131 and 133 connecting the walls 109 and 119. Upper edges of the walls 109, 119, 131 and 133 are chamfered to receive a lid 135. A sealant (not shown) seals gaps between the walls to form a tight seal that excludes contaminants.

Figure 4:
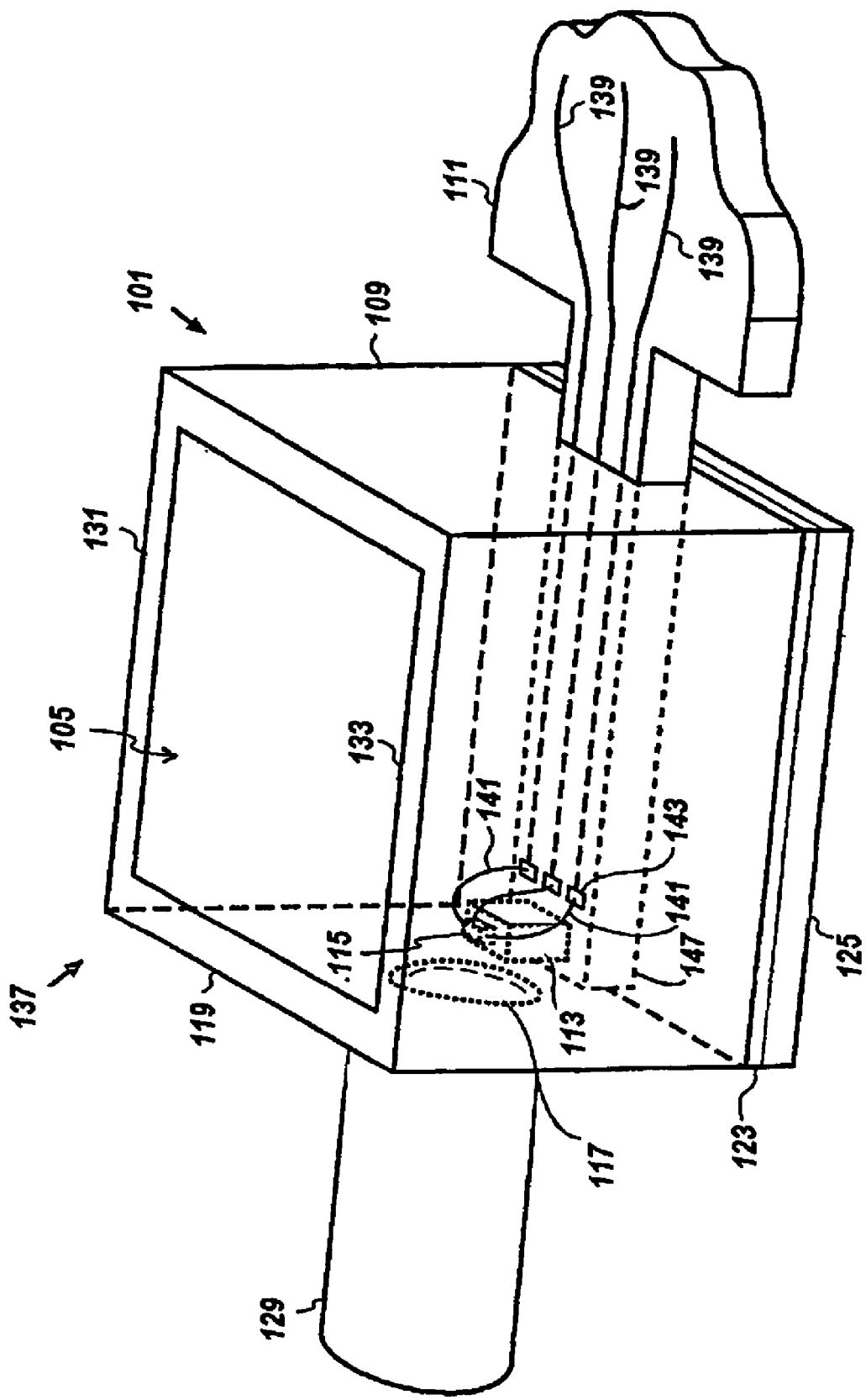
FIG. 4 is a perspective view of the embodiment shown in FIG. 1.

Referring now to FIG. 4, an opto-electronic assembly generally 137 includes the housing 101 as described above, the substrate 111 carrying a plurality of electrical conductors 139, and the opto-electronic device 115. The substrate is disposed in the opening 107 and extends into the cavity 105. The opto-electronic device is supported by the mount 113 and is in electrical communication with the electrical conductors 139 through a plurality of conductors 141. Each conductor 139 is connected to an associated one of the conductors 141, for example through a wire bond 143. A sealant may be used to fill gaps in the opening 107 between the substrate and the wall 109.

There are several ways to configure the substrate and the mount. In the embodiment depicted in FIGS. 1 and 4, an opening 145 is defined in an extremity 147 of the substrate. The substrate is inserted into the housing through the opening 107 such that the opening 145 is in alignment with the opening 121, and then the mount 113 is installed through both openings, projecting into the cavity 105.

Figure 6:
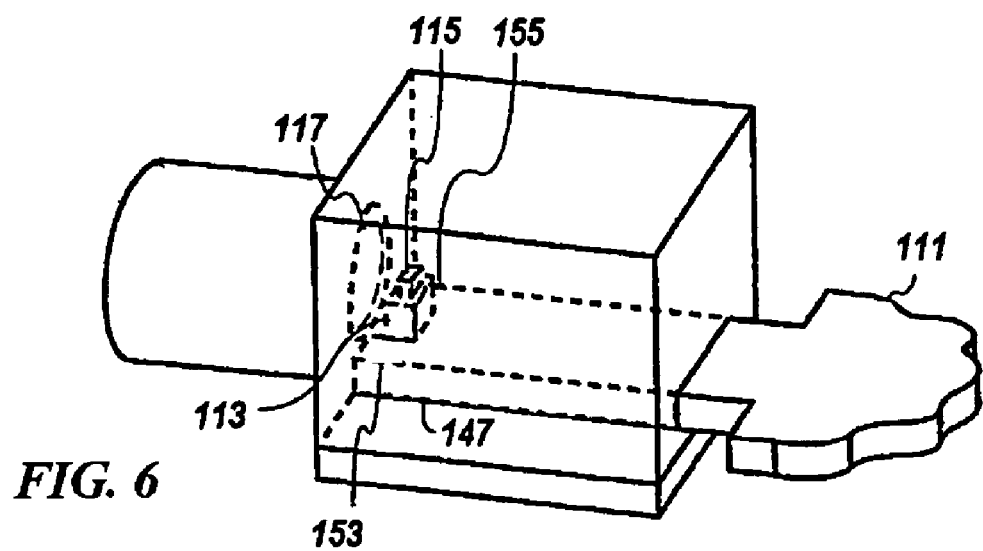
FIG. 6 is a perspective view of a portion of an alternate embodiment of an opto-electronic assembly.
Figure 7:
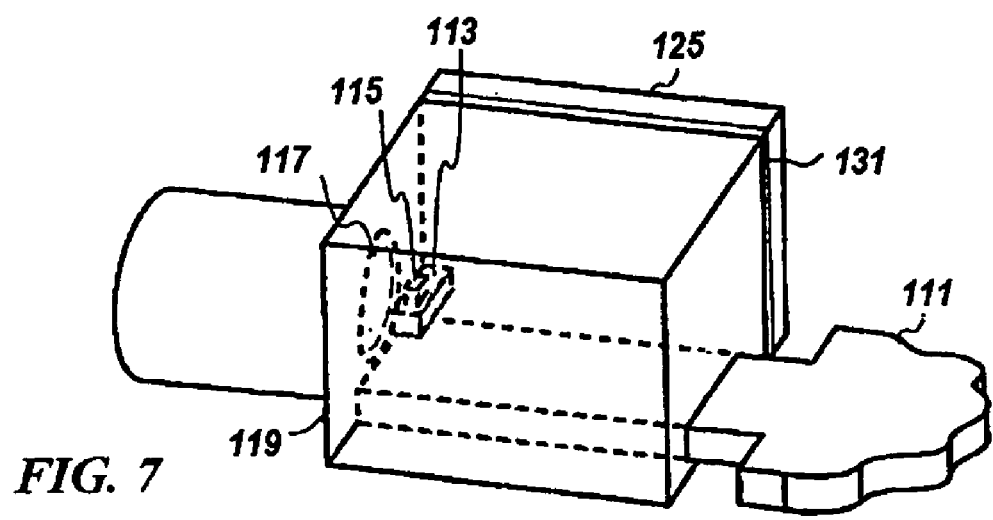
FIG. 7 is a perspective view of a portion of an alternate embodiment of an opto-electronic assembly.
Figure 5:
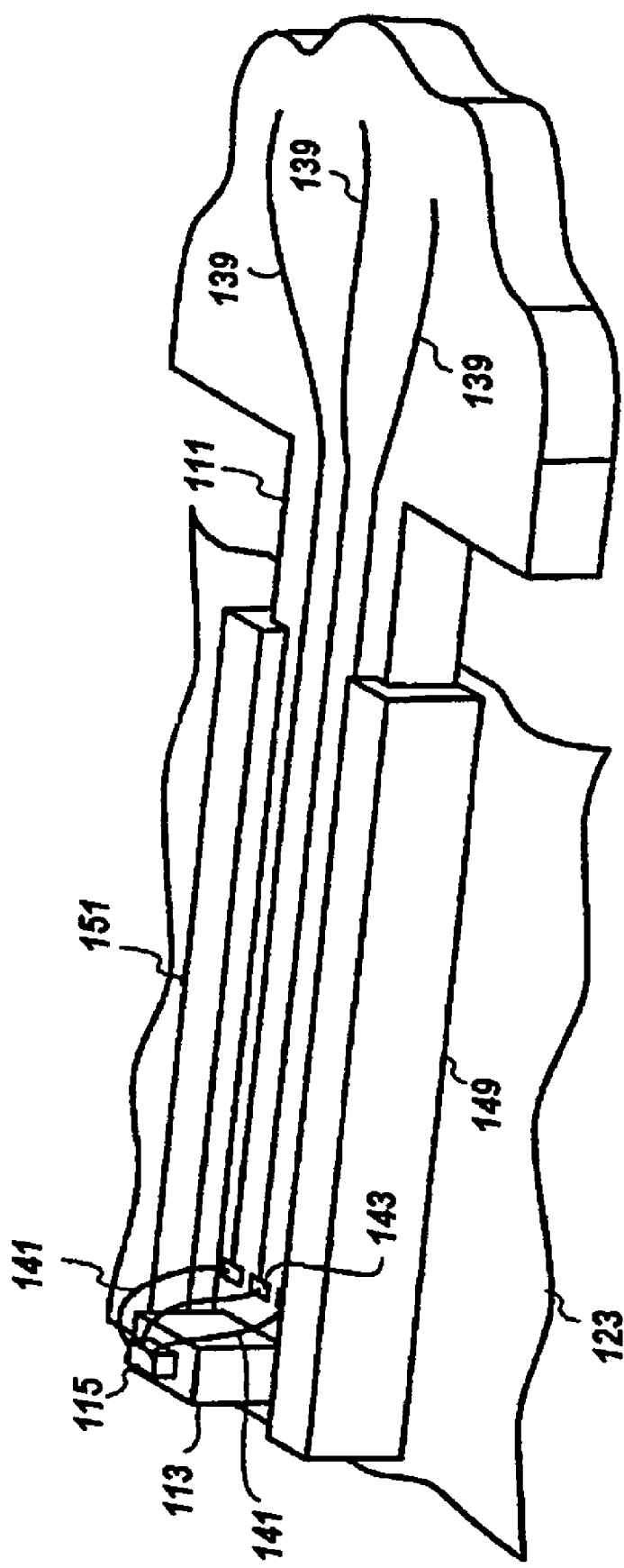
FIG. 5 is a perspective view of a portion of an alternate embodiment of an opto-electronic assembly.

In the embodiment shown in FIG. 2, the extremity 147 of the substrate abuts against the mount 113. In another embodiment as shown in FIG. 5, rails 149 and 151 are attached to the wall 123 to define a channel for receiving the substrate, and the extremity of the substrate abuts against the mount 113. In another embodiment as shown in FIG. 6, the extremity 117 of the substrate is notched to form projections 153 and 155 to fit around the mount 113. In another embodiment as shown in FIG. 7 the mount 113 projects from the sidewall 131 above the substrate.

In a transmitting application, the opto-electronic device 115 might be a laser diode, and the lens 127 would focus a light beam emitted by the laser diode to a focal point 157 as shown in FIG. 3. In a receiving application, the opto-electronic device 115 might be a photo detector, and the lens 127 would focus a beam of light originating elsewhere, for example a beam of light carried by an optical fiber (not shown) in the receptacle, onto the photo detector.

The lens 127 may be made from a polymer, glass or composite material. It may be fabricated by molding, replication, forming, or any other high-precision mass-volume technique. It may be assembled from singular piece parts into one monolithic part. It may have a variable vertex-to-vertex thickness as defined along the optical axis to adjust the lens focus to limit focal point shifts (indicated by an arrow 159 in FIG. 3) that might be caused by a change in temperature. In some embodiments the shape of the lens is aspherical to reduce beam aberrations and misalignment sensitivity.

The enclosure may be integrally fabricated using ceramic; polymer; a low expansion alloy such as Kovar™ available from Carpenter Technology Corporation, Wyomissing Pa.; or any other material having a low coefficient of thermal expansion. In some embodiments a "low" coefficient of thermal expansion means a linear coefficient of thermal expansion of less than $1 \times 10^{-6}$ over a temperature range of $-50°$ to $+350°$ Celsius. The use of such materials ensures that the opto-electronic device remains in alignment with the lens and receptacle despite any change in temperature.

The substrate may be a printed circuit board or some other suitable material. In some embodiments the mount 113 is fabricated using a material with a thermal conductivity larger than 1 watt per meter-Kelvin (W/m-K). This allows any heat generated by the electro-optical device 115 to be readily dissipated by conduction through the mount to the heat sink. The material should also have a low coefficient of thermal expansion so that the position of the electro-optical device with respect to the lens 28 may be maintained within very close tolerances even in the event of a relatively large temperature change.

An exterior surface of the enclosure or of the heat sink may be provided with grooves, protrusions or the like so that heat may readily be dissipated by convection.

The receptacle, which receives an optical fiber ferrule, may have an interior diameter that provides an interference fit with a received ferrule. Alternatively, the interior diameter may provide only a loose fit with a received ferrule, but the receptacle may include a slotted sleeve so that a ferrule may be received with an interference fit. The receptacle may be integrally formed with the wall 119.

The substrate may carry nothing other than the electrical conductors 139, or it may carry other active and passive electronic components (not shown) according to the characteristics of the electro-optical device 115. For example, if the opto-electronic device is a laser, transmitter drive components may be carried by the substrate. Other components (not shown) may also be carried by the mount 113. For example, in a transmitter application, a photodiode monitor may be supported by the mount 113 adjacent the laser and coupled thereto with a low cost injection molded optical coupling module.

Thermally conductive adhesive may be used to attach the heat sink to the enclosure, and a structural epoxy may be used to fix the lid in place.

Although the invention has been described as implemented in the above-described embodiments, it is not to be construed to be limited to the specific forms or arrangements of parts so described and illustrated. For example, the heat sink may include fins instead of being a flat plate so as to be more effective in dissipating heat. As another example, the housing, mount and receptacle may all be integrally formed to define a monolithic module. The invention is limited only by the claims.

We claim:

1. An opto-electronic housing comprising:
   an enclosure defining a cavity and an exterior;
   an opening through a wall of the enclosure and adapted to receive a substrate from the exterior for providing an electrical interface with an opto-electronic device in the cavity;
   a mount projecting into the cavity opposite the first opening and adapted to support an opto-electronic device, wherein the mount projects into the cavity through a second opening in a wall of the enclosure; and
   an optically transmissive region in a wall of the enclosure adjacent the mount, the optically transmissive region for communicating light between the opto-electronic device and the exterior.

2. An opto-electronic housing as in claim 1 wherein the mount is integrally formed with a wall of the enclosure.

3. An opto-electronic housing as in claim 1 and further comprising a heat sink in thermal communication with the mount and disposed outside the enclosure.

4. An opto-electronic housing as in claim 3 wherein the heat sink comprises a heat-dissipating plate.

5. An opto-electronic housing as in claim 4 wherein the heat-dissipating plate is substantially planar with an outside surface of the enclosure.

6. An opto-electronic housing as in claim 1 wherein the optically transmissive region comprises an opening.

7. An opto-electronic housing as in claim 1 wherein the optically transmissive region comprises a lens.

8. An opto-electronic housing as in claim 1 and further comprising a receptacle connected to the enclosure over the optically transmissive region and adapted to receive an optical fiber ferrule.

9. An opto-electronic assembly as in claim 1 wherein the enclosure comprises a plurality of walls and a sealant that seals a gap between adjacent ones of the walls.

10. An opto-electronic assembly comprising:
    an opto-electronic housing as in claim 1;
    a substrate carrying a plurality of electrical conductors, the substrate disposed in the opening and extending into the cavity; and
    an opto-electronic device supported by the mount and in electrical communication with the electrical conductors.

11. An opto-electronic assembly as in claim 10 wherein an extremity of the substrate is notched to straddle the mount.

12. An opto-electronic assembly as in claim 10 wherein an extremity of the substrate defines an opening to receive the mount.

13. An opto-electronic assembly as in claim 10 and further comprising a rail on an interior surface of the cavity defining a channel to receive the substrate.

14. An opto-electronic assembly as in claim 10 and further comprising a sealant that seals a gap between the substrate and the first opening.

* * * * *